(12) United States Patent
Sim

(10) Patent No.: US 6,542,432 B2
(45) Date of Patent: Apr. 1, 2003

(54) SUB WORD LINE DRIVE CIRCUIT FOR SEMICONDUCTOR MEMORY DEVICE

(75) Inventor: Jae-Yoon Sim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/965,583

(22) Filed: Sep. 26, 2001

(65) Prior Publication Data

US 2002/0051403 A1 May 2, 2002

(30) Foreign Application Priority Data

Oct. 30, 2000 (KR) ........................................ 2000-64056

(51) Int. Cl.[7] ................................................. G11C 8/00
(52) U.S. Cl. ................................. 365/230.06; 365/239
(58) Field of Search ............................ 365/230.06, 239

(56) References Cited

U.S. PATENT DOCUMENTS 6,118,723 A * 9/2000 Agata et al. ........... 365/230.03
6,333,877 B1 * 12/2001 Nagaoka et al. ............ 365/200

* cited by examiner

*Primary Examiner*—Michael T Tran
(74) *Attorney, Agent, or Firm*—Marger Johnson & McCollom, P.C.

(57) ABSTRACT

A semiconductor memory device includes a plurality of main word lines. A plurality of sub word lines correspond to each one of the main word lines. A plurality of sub word line drivers are also included, wherein each sub word line driver corresponds to one of the sub word lines and connects the corresponding sub word line to the corresponding main word line. The sub word line drivers charge the sub word lines up to a boosting voltage regardless of an activation order between a sub word line selection signal and the main word line. The sub word line drivers can include a first transistor for transferring the sub word line selection signal to the sub word line in response to an activation of the main word line. A second transistor is configured to connect the main word line to the sub word line in response to an activation of the sub word line selection signal. A third transistor is configured to connect the main word line to a gate of the first transistor in response to a high voltage. And a fourth transistor is configured to connect the sub word line selection signal to a gate of the second transistor in response to the high voltage.

10 Claims, 2 Drawing Sheets

SUB WORD LINE DRIVE CIRCUIT FOR SEMICONDUCTOR MEMORY DEVICE

This application relies for priority upon Korean Patent Application No. 2000-64056, filed on Oct. 30, 2000, the contents of which are herein incorporated by reference in their entirety.

FIELD OF THE INVENTION

The present invention relates generally to dynamic random access memory (DRAM) devices, and more particularly to a sub word line drive circuit of the DRAM device.

BACKGROUND OF THE INVENTION

FIG. 1 shows a layout of a conventional dynamic random access memory (DRAM) device. Referring to FIG. 1, a DRAM device is formed of a plurality of sub arrays 10 arranged with rows and columns. Each of the sub arrays 10 includes a plurality of word lines W/L, a plurality of bit line pairs BL and BLB, and a plurality of memory cells MC arranged on intersection regions of the word lines W/L and the bit line pairs BL and BLB. Sense amplification regions 20 are disposed between the sub arrays 10 in the row direction. Each of the sense amplification regions 20 includes a plurality of sense amplifiers connected to the bit line pairs BL and BLB, which extend in the row direction. As is well known to those skilled in the art, the sense amplifiers of the sense amplification regions 20 are shared with the adjacent sub arrays 10.

Continuing to refer to FIG. 1, sub word line drive regions 30 are disposed between the sub arrays 10 in the column direction. Each of the sub word line drive regions 30 includes a plurality of sub word line drivers SWD. A portion of the word lines W/L are selected by the sub word line drivers SWD of the sub word line drive regions 30 disposed on one side of the sub arrays 10. The rest of the word lines W/L are selected by the sub word line drivers SWD of sub word line drive regions 30 disposed on the other side. Each of the sub word line drivers SWD selects a corresponding sub word line W/L in response to the word line signals WLE provided from a main word line (or global word line) WLEi (where i=0~n, and n is a positive integer greater than 1) connected to a main word decoder 50, and a word line drive signal PXIj (where j=0~3) provided from a word line drive circuit (not shown). Conjunction regions 40 are disposed between the sub word line drive regions 30 in the row direction.

FIG. 2 is a circuit diagram showing the prior art sub word line driver SWD of FIG. 1. Referring to FIG. 2, the conventional sub word line driver SWD is formed of four N-channel metal-oxide semiconductor (NMOS) transistors M1 through M4. The first NMOS transistor M1 has a gate connected to a boosting voltage VPP, and a channel connected between a main word line signal WLE and a first node N1. The second NMOS transistor M2 has a gate connected to the first node N1, and a channel connected between a word line drive signal PXIj and an output node N2 coupled to a sub word line WL. The third NMOS transistor M3 has a channel connected between the main word line signal WLE and the output node N2, and a gate connected to the word line drive signal PXIj. The fourth NMOS transistor M4 has a gate connected to a complementary word line drive signal PXIjB of the word line drive signal PXIj, and a channel connected between the output node N2 and ground voltage VSS.

The main word line signal WLE and the word line drive signal PXIj are activated with a boosting voltage level VPP. During operation of the circuit, when the main word line signal WLE (or main word line selection signal) transitions to high, the first NMOS transistor M1 applies a voltage VPP-Vth (where Vth represents the threshold voltage of the first NMOS transistor M1) to the first node N1. Thereafter, when the word line drive signal PXIj (or sub word line selection signal) transitions to high, the voltage of the first node N1 is boosted up to a higher voltage (2VPP-Vth, for example). The boosting operation (or self-boosting operation) is conducted by coupling capacitance between the gate and drain of the second NMOS transistor M2, as is known in the art. Thus, the second NMOS transistor M2 sufficiently applies the boosting voltage VPP of the word line drive signal PXIj to the output node N2.

However, if the boosting voltage VPP of the main word line signal WLE is applied to the first NMOS transistor M1 after the boosting voltage VPP of the word line drive signal PXIj is applied to the drain of the second NMOS transistor M2, the voltage of the first node N1 is VPP-Vth. At that time, the third NMOS transistor M3 applies a voltage VPP-Vth to output node N2, while the second NMOS transistor M2 applies a lower voltage VPP-2Vth to the output node N2. Thus, the output node N2 is capable of charging up to a maximum voltage of VPP-Vth. The highest voltage at the output node N2, coupled to a cell transistor of memory cell MC, in this instance, is not enough to turn the cell transistor on.

As a result, the main word line signal WLE must be activated before the word line drive signal PXIj is activated, in order to sufficiently charge the sub word line WL up to the boosting voltage. In order to ensure the proper activation order of these signals, a predetermined time interval is established between the activation of the main word line signal WLE and the word line drive signal PXIj. That time interval increases the time required for performing a reliability test for the memory device.

In general, the test time per word line is several microseconds, and, as a result, a significant amount of time is required for testing an entire chip. It would be preferable for the main word lines to be sequentially activated by the activation of the word line drive signal PXIj, in order to reduce the test time. Unfortunately, if this test method is used with the prior art sub word line driver SWD, the voltage applied to the sub word line is defined as VPP-Vth, which is insufficient to turn a cell transistor of a memory cell on. In other words, it is impossible to use this test method to reduce the test time of the prior art memory device.

SUMMARY OF THE INVENTION

It is therefore an object of the present invention to provide a sub word line drive circuit for a semiconductor memory device that is capable of reducing the test time of the memory device.

In order to attain the above objects, according to one embodiment of the present invention, a semiconductor memory device includes a plurality of main word lines. A plurality of sub word lines are also included, each of which corresponds to one of the main word lines. A plurality of sub word line drivers are included, wherein each sub word line driver corresponds to one of the sub word lines, and connects the sub word line to the main word line. The sub word line drivers charge the sub word lines up to a boosting voltage regardless of an activation order between a sub word line selection signal and the main word line.

According to another aspect of this invention, a semiconductor memory device includes a plurality of main word lines. A plurality of sub word lines correspond to each of the main word lines. A plurality of sub word line drivers are also included, wherein each sub word line driver corresponds to one of the sub word lines and connects the sub word line to the main word line. Each of the sub word line drivers includes a first transistor for transferring the sub word line selection signal to the sub word line in response to an activation of the main word line and a second transistor connecting the main word line to the sub word line in response to an activation of the sub word line selection signal. In addition, a third transistor connects the main word line to a gate of the first transistor in response to a high voltage, and a fourth transistor connects the sub word line selection signal to a gate of the second transistor in response to the high voltage.

According to various embodiments constructed in accordance with the principles of the invention, the sub word line can be charged up to the boosting voltage regardless of an activation order between the main word line signal and the sub word line selection signal.

BRIEF DESCRIPTION OF THE DRAWINGS

The foregoing features and advantages of the invention will be more fully described in the accompanying Detailed Description of a Preferred Embodiment made with reference to the accompanying drawings in which like reference numerals denote like elements and in which.

DETAILED DESCRIPTION OF A PREFERRED EMBODIMENT

It should be understood that the description of this preferred embodiment is merely illustrative and that it should not be taken in a limiting sense. In the following detailed description, specific details are set forth in order to provide a more thorough understanding of the present invention. It will be obvious, however, to one skilled in the art that variations may be made in the specific implementations of the invention without departing from its principles.

Figure 1:
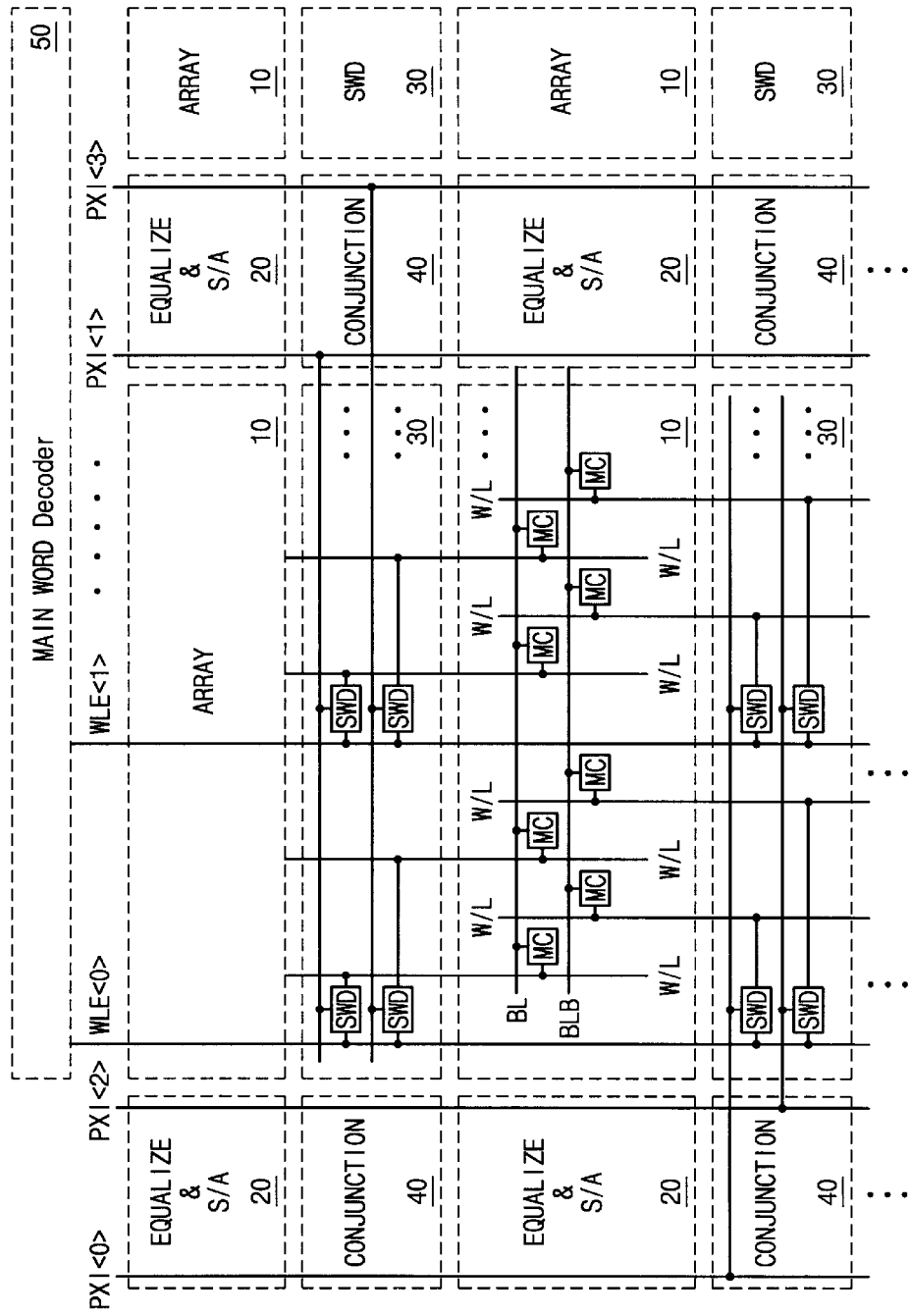
FIG. 1 is a block diagram of a layout of a conventional dynamic random access memory (DRAM) device.
Figure 2:
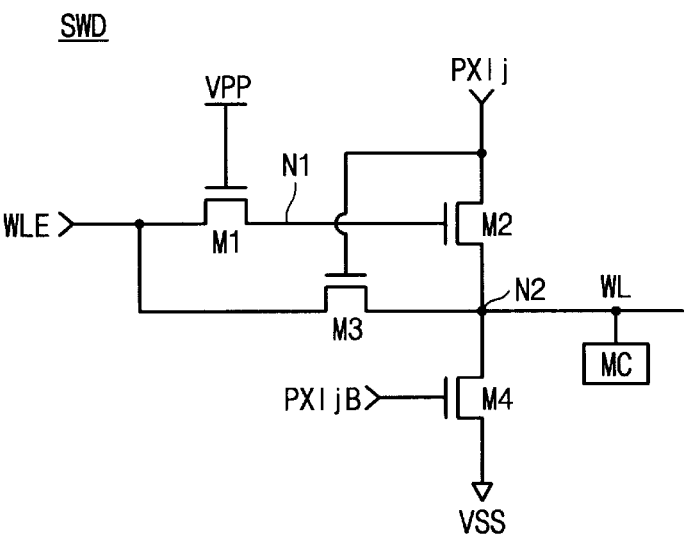
FIG. 2 is a circuit diagram of a conventional sub word line drive circuit as used in the DRAM device of FIG. 1.
Figure 3:
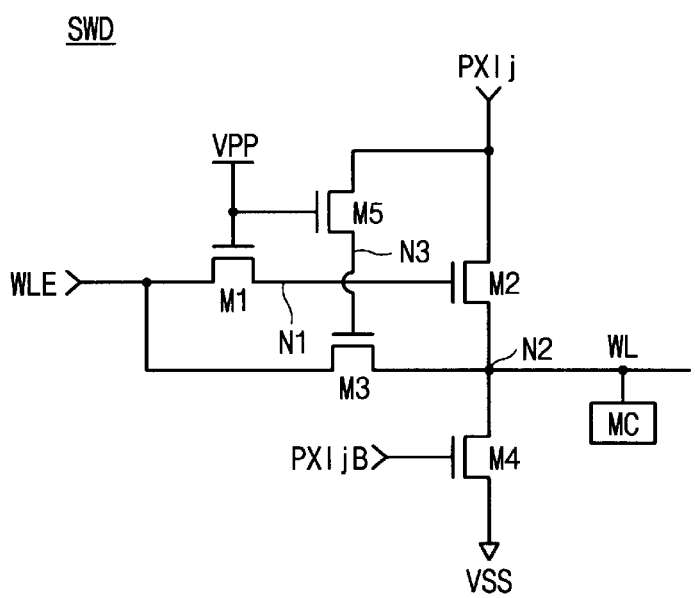
FIG. 3 is a circuit diagram of a sub word line drive circuit according to an embodiment of the present invention.

FIG. 3 is a circuit diagram of a sub word line driver according to an embodiment of the present invention. Referring to FIG. 3, the sub word line driver of the invention is similar to the conventional driver shown in FIG. 2, except that a fifth NMOS transistor M5 has been added. The fifth NMOS transistor M5 has a channel connected between a gate of the third NMOS transistor M3 and the word line drive signal PXIj, and a gate connected to a boosting voltage VPP. In this circuit, the sub word line WL can be charged with the boosting voltage VPP to turn on a cell transistor of a memory cell MC, even if the word line drive signal PXIj is activated before an activation of a main word line signal WLE. The operation of this sub word line driver will now be explained in detail.

If the main word line signal WLE is activated before the word line drive signal PXIj, the first NMOS transistor M1 applies a voltage VPP-Vth to a first node N1. At that time, the first NMOS transistor M1 is held in a shut-off state. Then, when the word line drive signal PXIj, having the boosting voltage VPP, is applied to the first node N1, the voltage of the first node N1 is boosted up to a voltage of about 2VPP-Vth due to coupling capacitance. Thus, the second NMOS transistor M2 transfers the boosting voltage VPP of the word line drive signal PXIj to an output node N2 coupled to the sub word line WL, turning the cell transistor on. Here, as a voltage of the third node N3 becomes VPP-Vth, the highest voltage provided from the NMOS transistor M3 to the output node N2 is VPP-2Vth.

If the word line drive signal PXIj is activated before the main word line signal WLE, the fifth NMOS transistor M5 applies a voltage VPP-Vth to a third node N3. At that time, the fifth NMOS transistor M5 is shut-off. Then, when the main word line signal WLE, having the boosting voltage VPP, is applied to the third node N3, the voltage of the third node N3 is boosted up to a voltage of about 2VPP-Vth due to coupling capacitance, because the fifth NMOS transistor M5 is in a shut-off state. Thus, the third NMOS transistor M3 sufficiently applies the boosting voltage VPP of the word line signal WLE to the output node N2 coupled to the sub word line WL.

Consequently, the boosting voltage VPP, capable of turning on the cell transistor of the memory cell MC, is sufficiently provided to the sub word line WL regardless of an activating order between the main word line signal WLE and the word line drive signal PXIj. Thus, it is possible to perform a reliability test with the main word lines being sequentially activated by the word line drive signal PXIj, and the time required for the reliability test of the semiconductor device can thereby be reduced.

While the invention has been described in terms of an exemplary embodiment, it is contemplated that it may be practiced in ways other than those explicitly outlined above. The invention should therefore be interpreted to cover all modifications and variations coming within the spirit and scope of the appended claims.

What is claimed is:

1. A semiconductor memory device, comprising:
   a plurality of main word lines;
   a plurality of sub word lines, wherein one or more sub word lines correspond to each of the main word lines; and
   a plurality of sub word line drivers, each sub word line driver connecting a corresponding sub word line to the corresponding main word line,
   wherein each sub word line driver is configured to charge the corresponding sub word line up to a boosting voltage regardless of an activation order between a sub word line selection signal and a main word line signal.

2. A semiconductor memory device according to claim 1, wherein each sub word line driver comprises:
   a transistor having a gate arranged to receive the boosting voltage, a source connected to receive the sub word line selection signal, and a drain connected to a gate of another transistor to enable transmission of the main word line signal to the sub word line.

3. A semiconductor memory device according to claim 1, wherein each sub word line driver comprises:
   a first transistor configured to transfer the sub word line selection signal to the sub word line in response to an activation of the main word line; and
   a second transistor configured to provide the sub word line selection signal to a gate of a third transistor in response to a high voltage.

4. A semiconductor memory device according to claim 1, wherein each sub word line driver comprises:
   a first transistor configured to transfer the sub word line selection signal to the sub word line in response to an activation of the main word line;

a second transistor configured to supply the main word line to the sub word line in response to an activation of the sub word line selection signal;

a third transistor configured to supply the main word line to a gate of the first transistor in response to a high voltage; and fourth transistor configured to supply the sub word line selection signal to a gate of the second transistor in response to the high voltage.

5. A semiconductor memory device, comprising:

a plurality of main word lines;

a plurality of sub word lines, wherein one or more sub word lines correspond to each of the main word lines; and a plurality of sub word line drivers each corresponding to one of the sub word lines, and connecting the corresponding sub word line to the corresponding main word line, wherein each of the sub word line drivers comprises a transistor having a gate arranged to receive a high voltage, a source connected to receive the sub word line selection signal, and a drain connected to a gate of another transistor to enable transmission of the main word line signal to the sub word line, and wherein the transistor is a second transistor configured to supply the sub word line selection signal to a gate of a third transistor in response to the high voltage, and wherein each sub word line driver further comprises a first transistor configured to transfer the sub word line selection signal to the sub word line in response to an activation of the main word line.

6. A semiconductor memory device, comprising:

a plurality of main word lines;

a plurality of sub word lines, wherein one or more sub word lines correspond to each of the main word lines; and a plurality of sub word line drivers each corresponding to one of the sub word lines, and connecting the corresponding sub word line to the corresponding main word line, wherein each of the sub word line drivers comprises a transistor having a gate arranged to receive a high voltage, a source connected to receive the sub word line selection signal, and a drain connected to a gate of another transistor to enable transmission of the main word line signal to the sub word line, wherein the transistor is a fourth transistor configured to supply the sub word line selection signal to a gate of a second transistor in response to the high voltage, and wherein each sub word line driver further comprises:

a first transistor configured to transfer the sub word line selection signal to the sub word line in response to an activation of the main word line;

the second transistor configured to supply the main word line to the sub word line in response to an activation of the sub word line selection signal; and a third transistor configured to supply the main word line to a gate of the first transistor in response to the high voltage.

7. A sub word line driver, comprising:

a transistor having a gate arranged to receive a boosting voltage, a source connected to receive the sub word line selection signal, and a drain connected to a gate of another transistor to enable transmission of a main word line signal to a sub word line, wherein the transistor is a second transistor configured to supply the sub word line selection signal to a gate of a third transistor in response to a high voltage, and wherein each sub word line driver further comprises a first transistor configured to transfer the sub word line selection signal to the sub word line in response to an activation of the main word line.

8. A sub word line driver, comprising:

a transistor having a gate arranged to receive a boosting voltage, a source connected to receive the sub word line selection signal, and a drain connected to a gate of another transistor to enable transmission of a main word line signal to a sub word line, wherein the transistor is a fourth transistor configured to supply the sub word line selection signal to a gate of a second transistor in response to a high voltage, and wherein each sub word line driver further comprises:

a first transistor configured to transfer the sub word line selection signal to the sub word line in response to an activation of the main word line;

the second transistor configured to supply the main word line to the sub word line in response to an activation of the sub word line selection signal; and a third transistor configured to supply the main word line to a gate of the first transistor in response to the high voltage.

9. A method of performing a reliability test on a semiconductor memory comprising a plurality of main word lines, said method comprising:

sequentially activating a plurality of word line drive signals to activate the plurality of main word lines;

wherein the word line drive signals are each activated before a main word line signal, thereby reducing the time for the reliability test.

10. A method of performing a reliability test according to claim 9, wherein the semiconductor memory further comprises a plurality of sub word line drivers and wherein each of the plurality of sub word line drivers comprises a transistor having a gate arranged to receive a high voltage, a source connected to receive a sub word line selection signal, and a drain connected to a gate of another transistor to enable transmission of a main word line signal to a sub word line.

* * * * *